(12) United States Patent
You et al.

(10) Patent No.: US 8,960,932 B2
(45) Date of Patent: Feb. 24, 2015

(54) LIGHT EMITTING DEVICE

(75) Inventors: Jae Sung You, Gyeonggi-do (KR); Jong Sup Song, Gyeonggi-do (KR)

(73) Assignee: Samsung Electronics Co., Ltd., Seoul (KR)

(*) Notice: Subject to any disclaimer, the term of this patent is extended or adjusted under 35 U.S.C. 154(b) by 377 days.

(21) Appl. No.: 13/436,102

(22) Filed: Mar. 30, 2012

(65) Prior Publication Data

US 2012/0300431 A1  Nov. 29, 2012

(30) Foreign Application Priority Data

May 27, 2011  (KR) .................. 10-2011-0050470

(51) Int. Cl.
| | |
|---|---|
| *F21V 9/16* | (2006.01) |
| *H01L 33/50* | (2010.01) |
| *H01L 25/075* | (2006.01) |
| *H01L 33/54* | (2010.01) |
| *H01L 33/58* | (2010.01) |

(52) U.S. Cl.
CPC ............. *H01L 25/0753* (2013.01); *H01L 33/54* (2013.01); *H01L 33/58* (2013.01); *H01L 2924/0002* (2013.01)
USPC .......................................................... 362/84

(58) Field of Classification Search
None
See application file for complete search history.

(56) References Cited

U.S. PATENT DOCUMENTS

| | | | | |
|---|---|---|---|---|
| 2002/0079506 | A1* | 6/2002 | Komoto et al. | 257/99 |
| 2004/0207999 | A1* | 10/2004 | Suehiro et al. | 362/84 |
| 2005/0093014 | A1* | 5/2005 | Seki et al. | 257/100 |
| 2007/0070530 | A1 | 3/2007 | Seo et al. | |
| 2007/0109952 | A1 | 5/2007 | Jeong et al. | |
| 2009/0284951 | A1 | 11/2009 | Muschaweck | |
| 2010/0039825 | A1 | 2/2010 | Yu et al. | |
| 2011/0063857 | A1 | 3/2011 | Li et al. | |

FOREIGN PATENT DOCUMENTS

| | | |
|---|---|---|
| CN | 100487935 C | 5/2009 |
| CN | 101651178 A | 2/2010 |
| DE | 10-2009-018088 A1 | 12/2009 |
| EP | 1715366 A2 | 10/2006 |
| JP | 2006-156662 | 6/2006 |
| JP | 2008-288540 | 11/2008 |
| JP | 2009-141038 A | 6/2009 |
| KR | 10-2008-0054177 A | 6/2008 |
| WO | 2010/123059 A1 | 10/2010 |

OTHER PUBLICATIONS

European Search Report issued in European Patent Application No. 12162158.5 dated Sep. 25, 2012.
Chinese Office Action issued in Chinese Application No. 201210129780.0 dated Jun. 5, 2014, with English translation.

* cited by examiner

*Primary Examiner* — Britt D Hanley
(74) *Attorney, Agent, or Firm* — McDermott Will & Emery LLP (57) ABSTRACT

A light emitting device includes: a substrate having a bar shape; a plurality of light emitting elements separately mounted in a lengthwise direction of the substrate on an upper surface of the substrate; and a light-transmissive cover formed to be upwardly convex, having one or more localized concave portions, and installed on the substrate to cover at least two of the plurality of light emitting elements together.

28 Claims, 4 Drawing Sheets

LIGHT EMITTING DEVICE

CROSS-REFERENCE TO RELATED APPLICATIONS

This application claims the priority of Korean Patent Application No. 10-2011-0050470 filed on May 27, 2011, in the Korean Intellectual Property Office, the disclosure of which is incorporated herein by reference.

BACKGROUND OF THE INVENTION

1. Field of the Invention

The present invention relates to a light emitting device.

2. Description of the Related Art

A light emitting diode (LED), a type of light emitting device which constitutes a light emission source by using a compound material such as GaAs, AlGaAs, GaN, InGaN, AlGaInP, or the like, is a semiconductor device capable of generating light of various colors according to the recombination of electrons and holes at p and n type semiconductor junctions when current is applied thereto.

An LED is environmentally-friendly, has a fast response time in the range of a few nano-seconds to thus be effective for a video signal stream, and is available for impulsive driving.

In addition, an LED has a color gamut of 100% or higher, can arbitrarily change the luminance of light, color temperature, or the like, by adjusting the quantity of light emitted by red, green and blue LED chips, and due to such advantages, the LED has been commonly used as a light emitting element for various light emitting devices.

In particular, recently, an LED using a nitride-based semiconductor has been utilized as a white light source in a variety of fields for applications in devices such as a keypad, a backlight, a traffic light, an airstrip landing light, and a general illumination source.

An LED is a point source of light having the characteristics of straightness, and in order to utilize an LED as a light source for illuminating a large area, a plurality of LEDs are required to be regularly arranged in consideration of an illumination area and used.

Thus, in order to implement such a structure, LEDs are manufactured in a package form and then the LED packages are arranged in a row on a substrate such as a PCB so as to be manufactured, and in this case, a manufacturing unit cost is increased due to the manufacturing of the packages.

Thus, a chip-on-module (COM) scheme capable of obtaining advantages in terms of cost in comparison with the method for manufacturing respective LED packages is preferred.

According to the COM scheme, a plurality of LED chips are mounted on a module and manufactured, so there is no need to manufacture an LED package.

In addition, a light-transmissive cover, such as a lens, may be used in order to reduce the difference in a color temperature generated in a process using an LED chip and a phosphor for converting the wavelength of light so as to convert the color of light into a white light source and enhance light distribution by increasing the speed of light.

In a related art lens formation method, a plurality of LED chips are bonded on a substrate, phosphors are applied to the respective LED chips, and a lens is then individually implemented on each of the LED chips. Here, the manufacturing process is complicated and unit manufacturing cost is increased.

In this method, the lens is formed through a process such as dispensing by adjusting the viscosity and amount of a liquid material used for forming the lens.

However, a lens formed according to such a method is limited in the configuration. Namely, the form or shape of the lens is mostly fixed, making it difficult to change the shape of the lens into various forms in consideration of the characteristics of a light emitting device.

Also, individually formed lenses have a certain tolerance in the aspect of standardization, resulting in a severe dispersion in dimensions of respective products, which results in the dispersion of light emitted from the LED chips not being uniform.

In addition, if phosphors are applied to respective LED chips and individual lenses are used for that purpose, deviation of the color temperature generated between the LED chips and the phosphors is increased.

Meanwhile, light from an LED has optical characteristics of straightness, such that the lens for the LED is manufactured in the shape of a convex lens aimed at generally diffusing light to the lateral side, so as to be used.

However, when lenses are individually formed on the respective LED chips in configuring a light emitting device by arranging the plurality of LED chips on a substrate, an area in which light beams emitted from the respective LED chips are not mixed is generated.

This is called a spot phenomenon. In detail, when a light diffusion cover such as a lens is installed at the light emission side of an LED chip, a portion of the area of the light emitted from the LED chip appears to be brighter while another portion of the area appears to be darker.

Namely, when the transmittance of the lens is too high, the luminance of the area in which the LED chip is positioned is relatively high, so the area is seen to be brighter, while an area in which the LED chip is not installed is seen to be darker so as to be viewed as if there was a dot present.

In order to prevent such a spot phenomenon, the transmittance of the lens is required to be lowered by a certain numerical value, and in this case, if a lens having a low transmittance is used to prevent the occurrence of a spot phenomenon, the intensity of illumination by the respective LED chips becomes relatively weak, thereby degrading the illumination effect overall.

In order to resolve this problem, a larger number of LED chips are required to be installed densely on the substrate, causing the unit manufacturing cost to be increased.

Meanwhile, a conventional lens is made of a resin such as silicon in order to match a light refractive index, and in this case, silicon is relatively costly, so a method for reducing the usage of silicon is required.

SUMMARY OF THE INVENTION

An aspect of the present invention provides a light emitting device capable of reducing a manufacturing time and cost of a product, enhancing a degree of freedom in the shape of a lens in a manufacturing process thereof, implementing a lens shape having a uniform specification, and generating uniform light by reducing a spot phenomenon generated in each of respective light emitting elements.

Another aspect of the present invention provides a light emitting device capable of reducing the difference in color temperature generated when a light emitting element and a phosphor are converted into a white light source.

Another aspect of the present invention provides a light emitting device capable of optimizing a light radiation angle by changing the pattern of a light-transmissive cover and widening light distribution by reducing the difference in the speed of light, thereby reducing the number light emitting elements in use and improving light efficiency.

According to an aspect of the present invention, there is provided a light emitting device including: a substrate; a plurality of light emitting elements separately mounted on the substrate; and a light-transmissive cover formed to be upwardly convex, having one or more localized concave portions, and installed on the substrate to cover at least two of the plurality of light emitting elements together.

The concave portion of the light-transmissive cover may be formed at a position corresponding to at least one of the plurality of light emitting elements.

The light-transmissive cover may be formed such that a vertical section, with respect to a lengthwise direction thereof, has an indented semi-spherical shape.

The light-transmissive cover may be configured such that its height is reduced toward edge portions thereof from a central portion thereof.

The light-transmissive cover may include a flat support unit in contact with the substrate and a plurality of convex portions formed to be separated in a lengthwise direction.

The light emitting elements may include at least one of white, red, blue, and green light emitting diode (LED) chips.

The substrate may have a plurality of recesses in the lengthwise direction in which the plurality of light emitting elements are mounted.

Side walls of each of the recesses may be formed as a light reflective face.

Side walls of each of the recesses may be formed to be sloped.

A resin packaging unit may be included to encapsulate the light emitting element within the recess.

The resin packaging unit may include a phosphor material for converting the wavelength of light emitted from the light emitting element.

The light-transmissive cover may be made of a plastic material, and a light refractive index matching unit may be formed between the light-transmissive cover and the recess.

The light refractive index matching unit may be formed of a film made of a silicon or epoxy material.

A step portion may be formed at an upper edge of the recess.

A resin packaging unit encapsulating the light emitting unit may be included in the recess, and a light wavelength conversion unit including a phosphor material for converting the wavelength of light emitted from the light emitting element may be formed in the step portion to cover an upper surface of the resin packaging unit.

The light wavelength conversion unit may be formed as a film.

The light-transmissive cover may be made of a plastic material, and a light refractive index matching unit may be formed between the light-transmissive cover and the step portion.

The light refractive index matching unit may be formed of a film made of a silicon or epoxy material.

According to an aspect of the present invention, there is provided a method for manufacturing a light emitting device, including: mounting a plurality of light emitting elements in a lengthwise direction on a substrate; forming resin to cover the light emitting elements on the substrate; and hardening the resin to have a convex shape such that one or more concave portions are formed at positions corresponding to one or more light emitting elements.

In the hardening of the resin, the resin may be hardened such that a vertical section of the resin, with respect to a lengthwise direction, has an indented semi-spherical shape.

In the hardening of the resin, the resin may be hardened such that the height of the resin is reduced toward edge portions thereof from a central portion thereof.

The hardening of the resin may include: dispensing a primary resin to cover the entirety of the light emitting elements on the substrate; hardening the dispensed primary resin such that it generally has a flat face and one or more concave portions are formed therein; dispensing a secondary resin onto the hardened primary resin; and hardening the dispensed secondary resin such that a convex portion is formed between concave portions.

As the resin, one of silicon and epoxy, or a mixture thereof may be used.

The method may further include: forming a plurality of recesses at regular intervals in a lengthwise direction at an inner side of the substrate, before preparing the substrate.

The method may further include: encapsulating a resin packaging unit within each of the recesses, before forming the resin.

The method may further include: forming a light refractive index matching unit on an upper surface of the resin packaging unit by using one of silicon and epoxy or a mixture thereof, before forming the resin.

The method may further include: forming a plurality of recesses having a step portion at an upper portion thereof at regular intervals in the lengthwise direction at the inner side of the substrate, before preparing the substrate.

The method may further include: encapsulating a resin packaging unit within each of the recesses; and forming a light wavelength conversion unit including a phosphor material in each of the step portions to cover an upper surface of the resin packaging unit, before forming the resin.

The method may further include: forming a light refractive index matching unit on an upper surface of the substrate by using one of silicon or epoxy or a mixture thereof to cover the light wavelength conversion unit, before forming the resin, and, in the forming of the resin, the resin may be made of a plastic material.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Embodiments of the present invention will now be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

Figure 1:
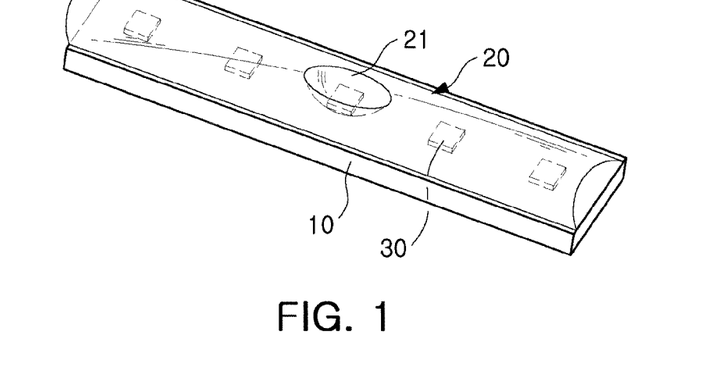
FIG. 1 is a schematic perspective view of a light emitting device according to an embodiment of the present invention.

With reference to FIG. 1, a light emitting device according to an embodiment of the present invention may include a substrate 10, a plurality of light emitting diode (LED) chips 30, light emitting elements, mounted at regular intervals in a lengthwise direction of the substrate 10 on an upper surface of the substrate 10, and a light-transmissive cover 20 installed on and along the substrate 10 in order to entirely cover the plurality of LED chips 30. Here, the light-transmissive cover 20 may be installed in the lengthwise direction of the substrate 10.

The substrate, a type of printed circuit board (PCB), may be made of an organic resin material containing epoxy, triazine, silicon, polyimide, or the like, and any other organic resin material, or may be made of a ceramic material such as AlN, $Al_2O_3$, or the like, or a metal and a metal compound.

Preferably, the substrate 10 is a metal-core printed circuit board (MCPCB), a type of metal PCB, in terms of heat releasing.

The substrate 10 provides a space allowing the plurality of LED chips 30 to be mounted thereon, and includes a conductive pattern (not shown) to transfer an electrical signal to the LED chips 30 to be mounted thereon.

Also, the substrate 10 may be made of a material having high heat conduction efficiency, e.g., metal such as aluminum (Al) so as to perform a heat releasing function releasing heat generated while the plurality of LED chips 30 operate.

In the present embodiment, the substrate 10 is extendedly formed in the shape of a bar, and the plurality of LED chips 30 are mounted at regular intervals on an upper surface of the bar-shaped substrate 30. Thus, after the light emitting device is completely manufactured, it can be easily applied to a backlight unit, or the like, so as to be used.

The light-transmissive cover 20 is made of a transparent or translucent material, preferably a material such as silicon, silica, or the like, to allow light emitted from the LED chips 30 to be diffused in an upward direction therethrough.

Also, the light-transmissive cover 20 has the bar shape along the substrate 10, but the shape of the light-transmissive cover 20 is not limited thereto.

The light-transmissive cover 20 may be formed through being dispensed directly on the substrate, and if the light-transmissive cover 20 is large, it can be separately manufactured and installed on the substrate.

The LED chips 30 have the characteristic of straightness. Thus, in order to extensively disperse and utilize light from the LED chips 30, point light sources, and implement light uniformity, the light-transmissive cover 20 is generally formed to be upwardly convex and installed on the substrate 10.

The light-transmissive cover 20 includes a concave portion 21 in a position corresponding to an LED chip 30 mounted at the center of the substrate 10.

The concave portion 21 has a certain radius of curvature on an optical axis of the light-transmissive cover 20.

In the present embodiment, only one concave portion 21 is formed at the center of the substrate 10, but the present invention is not limited thereto and a plurality of concave portions may be formed at regular intervals on the light-transmissive cover 20 as necessary, and the positions of the plurality of concave portions may be set to correspond to an upper side of LED chips 30 other than a central LED chip 30.

The light-transmissive cover 20 in FIG. 1 is configured to have the shape of cylinder having a vertical section, with respect to a lengthwise direction, has an indented semi-spherical shape. However, the present invention is not limited thereto and the light-transmissive cover 20 may be manufactured such that the vertical section thereof with respect to the lengthwise direction has various other shapes such as a triangular shape, a quadrangular shape, a trapezoidal shape, or the like.

Figure 2:
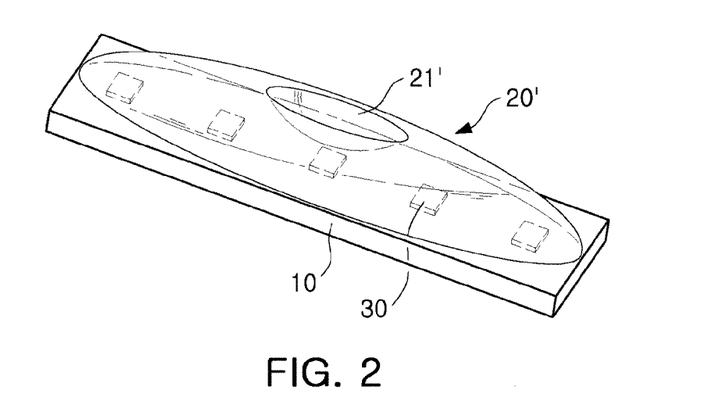
FIG. 2 is a schematic perspective view showing another example of a light-transmissive cover of the light emitting device according to an embodiment of the present invention.

In FIG. 2, a light-transmissive cover 20' formed to have an oval shape such that its height is reduced toward edge portions from a central portion, namely, the height of the central portion is relatively high compared with the edge portions, is illustrated. The light-transmissive cover 20' has a concave portion 21' at a position corresponding to the LED chip 30.

Figure 3:
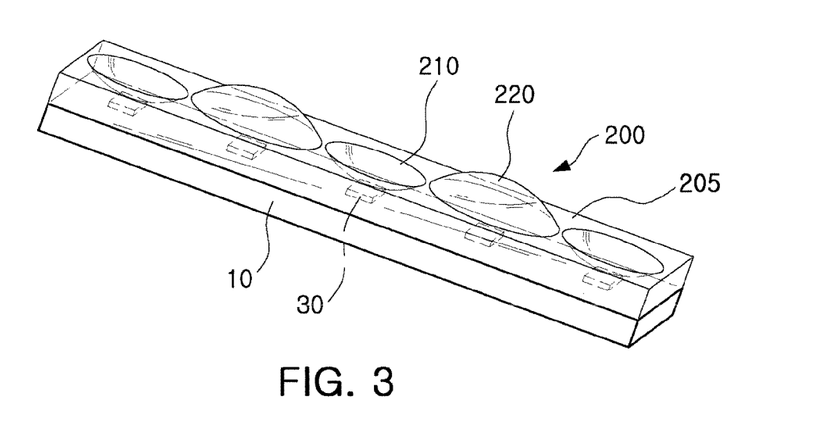
FIG. 3 is a schematic perspective view showing another example of a light-transmissive cover of the light emitting device according to an embodiment of the present invention.

FIG. 3 illustrates a light-transmissive cover 200 having an array shape.

The array type light-transmissive cover 200 is made of a transparent or translucent material, and has a support unit 205 configured to have a generally flat plate-like shape such that it is in contact with the substrate 10, and includes a plurality of convex portions 220 formed at regular intervals in the lengthwise direction on an upper surface of the support unit 205.

Concave portions 210 are formed between convex portions 220 formed on the light-transmissive cover 200. The light-transmissive cover 200 is configured such that the concave portions are formed at positions corresponding to the LED chips 30 while the convex portions 220 are formed at positions in which the LED chips 30 are not mounted.

Here, the specification, such as the interval between the convex portion 220 and the concave portion 210 of the light-transmissive cover 200 and the radius of curvature, the width, and the depth of each of the convex portion 220 and the concave portion 210, is adjusted to meet optimum conditions in which the number of LED chips 30 in use can be reduced and the thickness of the product can become thinner by widening a distribution of light emitted from the LED chips 30.

Meanwhile, when a lens of each of the plurality of LED chips is separately manufactured as in the related art, a spot phenomenon may take place in the LED chips 30.

In the present embodiment, the single light-transmissive cover 200 is installed on the substrate 10 to cover the entirety of the LED chips such that a spot phenomenon generated by the respective LED chips 30 is reduced as light emitted from the LED chips 30 is mixed therewith.

Figure 4:
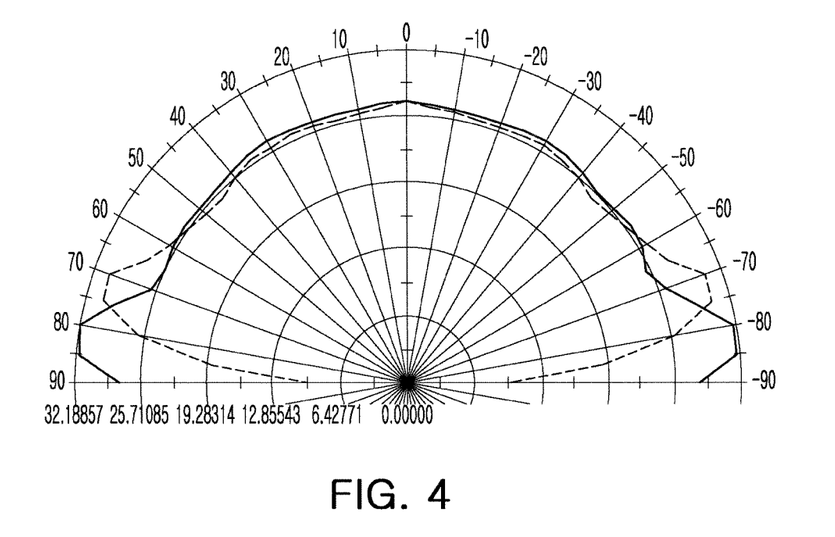
FIG. 4 is a graph showing light distribution when convex portions of an array type light-transmissive cover are formed at an upper side of light emitting elements.

FIG. 4 is a graph showing light distribution when a portion, of a light-transmissive cover, in which an LED chip is positioned, has the shape of a convex lens in the light emitting device including the array type light-transmissive cover illustrated in FIG. 3.

Figure 5:
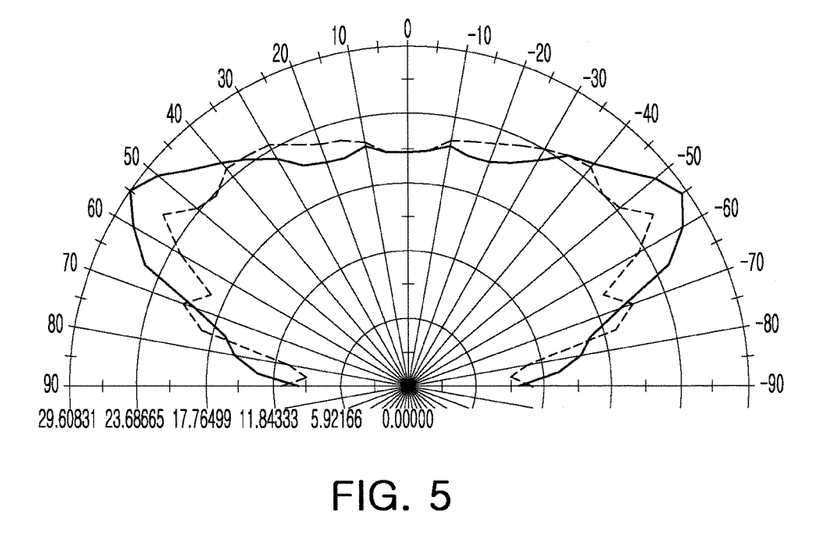
FIG. 5 is a graph showing light distribution when concave portions of an array type light-transmissive cover are formed at an upper side of light emitting elements.

FIG. 5 is a graph showing light distribution when a portion of a light-transmissive cover, in which the LED chip is positioned, has the shape of a concave lens in the light emitting device including the array type light-transmissive cover illustrated in FIG. 3.

With reference to FIG. 4, it is noted that, when the portion of the light-transmissive cover 200, in which the LED chip 30 is positioned, has the shape of a convex lens, light is particularly concentrated in the portion of the light-transmissive cover 200 in which the LED chip 30 is positioned according to the radiation angle, and light intensity in the other portions is weak so as to have low light distribution, causing a spot phenomenon, or since light dispersion is not properly made overall, light efficiency is degraded.

Meanwhile, with reference to FIG. 5, when the portion of the light-transmissive cover 200, in which the LED chip 30 is positioned, is formed as the concave portion 210, light is evenly distributed overall without regard to the radiation angle, causing a small amount of a spot phenomenon, and light is properly distributed overall to improve light efficiency.

In the present embodiment, any light emitting elements may be used so long as they can be used as a light source, and preferably, an LED is employed in terms of a reduction in size of a light source and high efficiency.

An LED, a light source that generates light according to a voltage applied thereto, is largely used in an area where a white light source, such as a backlight unit, is required.

The LED chip 30 is connected to a conductive pattern formed on the substrate through wire bonding or flip-chip bonding. Preferably, the LED chips 30 are arranged in series on the substrate 10.

A white LED chip is used as an LED, and it may emit red, green or blue light.

Also, the LED may emit white light as mixture of the three colors, and LED chips emitting light each of the three colors may be installed and a particularly desired color other than the three colors may be expressed by applying different voltages to the respective chips.

White light may be expressed by a single color LED chip, e.g., a blue LED chip, and a phosphor having a particular color, rather than by a white LED chip.

This is based on the fact that white light is expressed as unique respective colors of light beams generated from the LED chips are mixed while they are transmitting through phosphors.

In other words, at least one of red, blue, and green LED chips may be further included, and in this case, a light wavelength conversion unit including a phosphor material (to be described) for converting the wavelength of light beams emitted from the red, blue, and green chips into white light is required.

The light wavelength conversion unit includes a phosphor material for converting the wavelength of light emitted from the LED chips, and may further contain a diffusion material for smoothly diffusing light.

Figure 6:
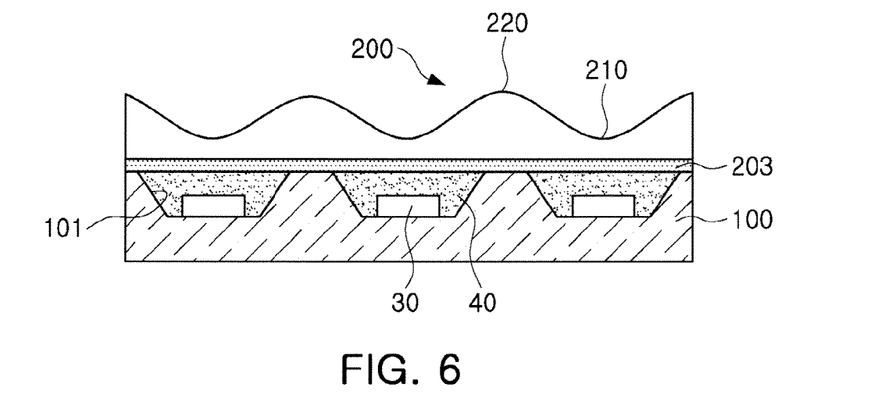
FIG. 6 is a cross-sectional view of light emitting device employing a substrate having recesses according to an embodiment of the present invention.

FIG. 6 shows an embodiment including such a light wavelength conversion unit, including a substrate having a recess structure and an array type light-transmissive cover applied to the substrate.

With reference to FIG. 6, a plurality of recesses 101 are formed as chip mount areas, on which the LED chips 30 are mounted, in the lengthwise direction on the substrate 100, and the light-transmissive cover 200 is installed on the recesses 101.

Here, the concave portion 210 formed between the convex portions 220 of the light-transmissive cover 200 is installed to be positioned at an upper side of each of the LED chips 30.

The recesses 101 are configured such that one side thereof is opened to allow light emitted from the mounted LED chips 30 to be radiated to the outside and the widths and lengths of bottom surfaces thereof are adjusted to fit the size of the mounted LED chip 30.

In general, the LED chip 30 is a light source having the shape of a hexagonal pillar, so light is generated from each face thereof.

Since a large quantity of light is generated laterally from the LED chip 30, in order to reduce the loss of light, a reflective unit is required to be positioned at the lateral side of the LED chip 30 to upwardly change the path of light emitted laterally from the LED chip 30.

To this end, the height of side walls of the recess 101 is adjusted to fit the mounted LED chip 30 so as to serve as a light reflective face reflecting light emitted laterally from the LED chip 30.

Namely, since light emitted from the LED chip 30 is reflected from the side walls of the recess 101 to change the path of light toward a front side, a loss of light can be minimized.

Also, the degree of dispersion of light emitted from the LED chip 30 is adjusted by the recess 101 and since the light whose dispersion degree has been adjusted is transferred to the light-transmissive cover 200, light distribution can become even.

The side walls of the recess 101 may be formed to be vertical, and in consideration of the fact that an illumination area of light emitted from the LED chip 30 differs according to the slope of the side walls, the side walls of the recess 101 may be sloped such that the quantity of light reflected to the front and the quantity of light dispersed to the side can be effectively adjusted.

The tilt of the slope of the side walls of the recess 101 may be changed within various ranges in consideration of the orientation angle and the characteristics of the LED chip 30, and may be selectively used to exhibit desired light characteristics according to a product in use.

In consideration of such matters, the tilt of the slope of the side walls of the recess 101 is preferably 30° to 60°, and more preferably, about 45°.

A reflective layer such as a coated film (not shown) made of a metal material such as aluminum (Al), or the like, may be formed on the side walls of the recess 101 in order to further enhance the reflectance of light transmitted to the LED chip 30.

A light-transmissive resin packaging unit 40 encapsulating the LED chip 30 is formed within the recess 101 in order to protect the LED chip 30 and improve external light extraction efficiency by matching a refractive index of the material constituting the LED chip 30 and that of the exterior.

Preferably, the resin packaging unit 40 is made of a resin such as silicon, epoxy, or silica having high transparency that allows light emitted from the LED chip 30 to pass therethrough while minimizing a loss of light.

Here, the resin packaging unit 40 may be made of an elastic resin.

An elastic resin, a gel type resin such as silicon, or the like, refers to a material which is scarcely changed by short wavelength light, not suffering effects such as yellowing, and has a high refractive index to have excellent optical characteristics.

Also, unlike epoxy, the elastic resin maintains the state of gel or an elastomer even after a hardening operation, so it can more stably protect the LED chip against thermal stress, vibrations, an external impact, or the like.

Also, the resin packaging unit 40 is filled in the recess 101 in a liquid state and is then hardened, so the use of the elastic resin can obtain an effect in which internal bubbles are exposed to external air in the hardening process so as to be smoothly released.

Meanwhile, the resin packaging unit 40 may further include a phosphor material to be configured as a light wavelength conversion unit for converting the wavelength of light emitted from the LED chip 30 to change monochromatic light into white light, or the like.

Here, the resin packaging unit 40 may further include an ultraviolet ray absorbent to absorb ultraviolet rays emitted from the LED chip 30.

In FIG. 6, the array type light-transmissive cover is illustrated as an example, but the present invention is not limited thereto and a light-transmissive cover having various shapes such as a cylindrical shape, an oval shape, or the like, may be applied to the substrate having the recess structure.

Figure 7:
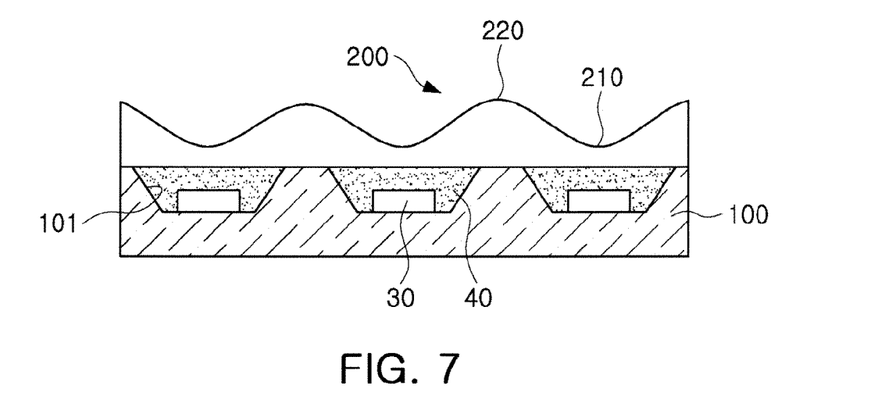
FIG. 7 is a cross-sectional view showing a structure when the light-transmissive cover is made of a plastic material in the light emitting device employing a substrate having recesses according to an embodiment of the present invention.

FIG. 7 shows an embodiment in which the structure of the light emitting device of FIG. 6 is modified, illustrating a structure including a substrate having a recess structure, an array type light-transmissive cover applied to the substrate, and a light refractive index matching unit formed between the light-transmissive cover and the recess.

With reference to FIG. 7, a plurality of recesses 101 are formed as chip mount areas, on which the LED chips 30 are mounted, in the lengthwise direction on the substrate 100, and the light-transmissive cover 200 is installed on the recesses 101.

Here, the concave portion 210 formed between the convex portions 220 of the light-transmissive cover 200 is installed to be positioned at an upper side of each of the LED chips 30.

The recesses 101 are configured such that one side thereof is opened to allow light emitted from the mounted LED chips 30 to be radiated to the outside and the width and length of a bottom surface thereof are adjusted to fit the size of the mounted LED chip 30.

Here, the height of the side walls of the recess 101 is adjusted to fit the LED chip 30, so the side walls of the recess 101 serve as light reflective faces reflecting light emitted laterally from the LED chip 30.

The side walls of the recess 101 may be formed to be vertical, and in consideration of the fact that an illumination area of light emitted from the LED chip 30 differs according to the slope of the side walls, the side walls of the recess 101 may be sloped such that the quantity of light reflected to the front and the quantity of light emitted laterally can be effectively adjusted.

A reflective layer such as a coated film (not shown) made of a metal material such as aluminum (Al), or the like, may be formed on the side walls of the recess 101 in order to further enhance the reflectance of light transmitted to the LED chip 30.

A light-transmissive resin packaging unit 40 encapsulating the LED chip 30 is formed within the recess 101 in order to protect the LED chip 30 and improve external light extraction efficiency by matching a refractive index of the material constituting the LED chip 30 and that of the exterior.

Here, the recess 101 serves as a dam of sorts, preventing a material constituting the resin packaging unit 40 from overflowing.

Preferably, the resin packaging unit 40 is made of a resin such as silicon, epoxy, or silica having high transparency that allows light emitted from the LED chip 30 to pass therethrough while minimizing a loss of light.

Also, the resin packaging unit 40 may further include a phosphor material so as to be configured as a light wavelength conversion unit for converting the wavelength of light emitted from the LED chip 30 to change monochromatic light into white light, or the like.

In the present embodiment, the light-transmissive cover 200 is made of a plastic material such as polycarbonate (PC). This is because plastic is relatively inexpensive as compared with a resin such as silicon or epoxy.

However, in terms of its characteristics, plastic cannot match the refractive index of light which has passed through the light-transmissive cover 200 and that of light which has passed through the resin packaging unit 40, so a light refractive index matching unit 203 made of a resin such as silicon, epoxy, or silica is formed between the light-transmissive cover 200 and an upper edge of the recesses 101 in order to match the light refractive indexes.

Here, preferably, the light refractive index matching unit 203 is configured as a thin resin film in order to sufficiently perform the light refractive index matching while reducing the unit cost by minimizing the amount of material used therein.

In FIG. 7, the array type light-transmissive cover is illustrated as an example, but the present invention is not limited thereto and a light-transmissive cover having various shapes such as a cylindrical shape, an oval shape, or the like, may be applied to the substrate having the foregoing structure.

Figure 8:
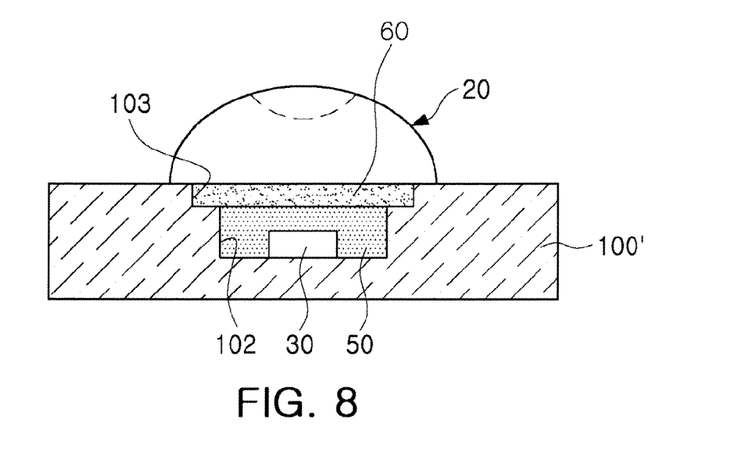
FIG. 8 is a cross-sectional view of a light emitting device employing a substrate having multiple recesses according to an embodiment of the present invention.

FIG. 8 shows another embodiment of a light emitting device, including a substrate having a dual-recess structure and a cylindrical light-transmissive cover applied to the substrate.

With reference to FIG. 8, a plurality of recesses 102 are formed as chip mount areas, on which the LED chips 30 are mounted in the lengthwise direction on the substrate 100', and the light-transmissive cover 20 is installed on the recess 102.

Here, a concave portion 21 of the light-transmissive cover 20 is installed to be positioned at an upper side of the LED chip 30.

The recesses 102 are configured such that one part thereof is opened to allow light emitted from the mounted LED chips 30 to be radiated to the outside and the width and length of a bottom surface thereof are adjusted to fit the size of the mounted LED chip 30.

Here, the height of the side walls of the recess 102 is adjusted to fit the LED chip 30, so the side walls of the recess 102 serve as light reflective faces reflecting light emitted laterally from the LED chip 30.

The side walls of the recess 102 may be formed to be vertical, and in consideration of the fact that an illumination area of light emitted from the LED chip 30 differs according to the slope of the side walls, the side walls of the recess 102 may be sloped such that the quantity of light reflected to the front and the quantity of light emitted laterally can be effectively adjusted.

A reflective layer such as a coated film (not shown) made of a metal material such as aluminum (Al), or the like, may be formed on the side walls of the recess 102 in order to further enhance the reflectance of light transmitted to the LED chip 30.

A light-transmissive resin packaging unit 50 encapsulating the LED chip 30 is formed within the recess 101 in order to protect the LED chip 30 and improve external light extraction efficiency by matching a refractive index of the material constituting the LED chip 30 and that of the exterior.

Preferably, the resin packaging unit 50 is made of a resin such as silicon, epoxy, or silica having high transparency that allows light emitted from the LED chip 30 to pass therethrough while minimizing a loss of light.

In the present embodiment, a step portion 103 is formed at an upper edge of the recess 102.

According to circumstances, a plurality of step portions may be formed to have a staircase structure.

A light wavelength conversion unit 60 is formed in the step portion 103 to cover an upper surface of the resin packaging unit 50. The light wavelength conversion unit includes a phosphor material for converting the wavelength of light emitted from the LED chip 30 to convert monochromic light into white light, or the like.

When the recess 102 has the dual-structure, the size of the light wavelength conversion unit 60 including a phosphor material can be further reduced to reduce the unit manufacturing cost.

In FIG. 8, the cylindrical light-transmissive cover is illustrated as an example, but the present invention is not limited thereto and a light-transmissive cover having various shapes such as an oval shape, an array shape, or the like, may be applied to the substrate having the foregoing structure.

Figure 9:
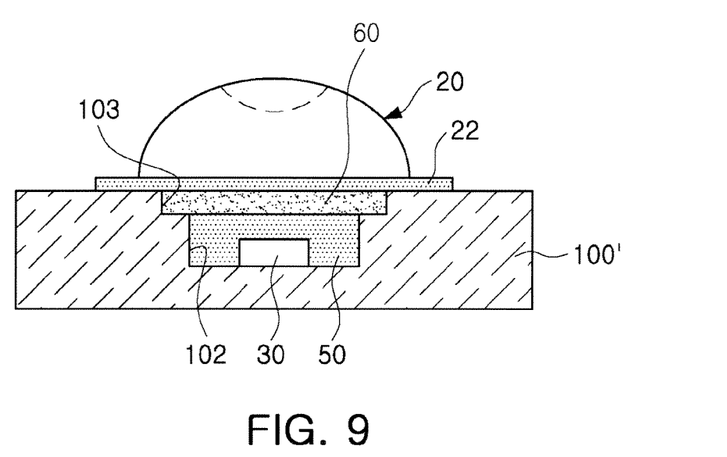
FIG. 9 is a cross-sectional view showing a structure when the light-transmissive cover is made of a plastic material in the light emitting device employing the multiple recesses according to an embodiment of the present invention.

FIG. 9 shows an embodiment obtained by modifying the structure of the light emitting device illustrated in FIG. 8, including a substrate having a dual-recess structure, a cylindrical light-transmissive cover applied to the substrate, and a light refractive index matching unit formed between the light-transmissive cover and the light wavelength conversion unit.

In the present embodiment, the light-transmissive cover 20 is made of a plastic material such as PC. This is because plastic is relatively inexpensive as compared with the resin such as silicon or epoxy.

However, in terms of its characteristics, plastic cannot match the refractive index of light which has passed through the light-transmissive cover 20 and that of light which has passed through the resin packaging unit 50, so a light refractive index matching unit 22 made of a resin such as silicon, epoxy, or silica is formed between the light-transmissive cover 20 and an upper edge of the recess 102 in order to match the light refractive indexes.

Here, preferably, the light refractive index matching unit 22 is configured as a thin resin film in order to sufficiently perform the light refractive index matching while reducing the unit cost by minimizing the amount of material used therein.

In FIG. 9, the cylindrical light-transmissive cover is illustrated as an example, but the present invention is not limited thereto and a light-transmissive cover having various shapes such as an oval shape, an array shape, or the like, may be applied to the substrate having the foregoing structure. Also, other portions are similar to those of the embodiment illustrated in FIG. 8, so a detailed description will be omitted.

As set forth above, according to embodiments of the invention, since the light-transmissive cover is installed on the substrate to entirely cover the plurality of LED chips, a manufacturing time and cost can be reduced in manufacturing a product, and since the degree of freedom in design is increased over a restriction in the shape of a lens in manufacturing the lens, various shapes of lenses can be manufactured and uniform lens shapes can be implemented.

Also, since light beams emitted from the respective LED chips are mixed in the interior of the single light-transmissive cover including both concave lens and convex lenses in combination, a spot phenomenon can be reduced.

In addition, since a light refractive index matching unit is formed between the light-transmissive cover and the light emitting element, the light-transmissive cover may be made of low-priced plastic over existing silicon, reducing the unit manufacturing cost.

Moreover, in the substrate structure having recesses, since the phosphor layer is configured as a thin film so as to be used, facilitating the manufacturing, reducing manufacturing costs, and reducing a dispersion of color temperature, thus enhancing reliability of the product.

While the present invention has been shown and described in connection with the embodiments, it will be apparent to those skilled in the art that modifications and variations can be made without departing from the spirit and scope of the invention as defined by the appended claims.

What is claimed is:

1. A light emitting device, comprising:
a substrate;
a plurality of light emitting elements separately disposed on the substrate; and
a light-transmissive cover having an upwardly convex portion and two or more concave portions, and disposed on the substrate to cover at least two of the plurality of light emitting elements together, wherein:
the two or more concave portions of the light-transmissive cover are defined at positions corresponding to two or more of the plurality of light emitting elements, and
the convex portion is defined between adjacent ones of the two or more concave portions.

2. The light emitting device of claim 1, wherein:
the plurality of light emitting elements are disposed on the substrate in a lengthwise direction of the substrate, and
the light-transmissive cover includes a vertical section, with respect to the lengthwise direction of the substrate, having an indented semi-spherical shape.

3. The light emitting device of claim 1, wherein the light-transmissive cover is configured such that its height is reduced toward edge portions thereof from a central portion thereof.

4. The light emitting device of claim 1, wherein:
the plurality of light emitting elements are disposed on the substrate in a lengthwise direction of the substrate, and
the light-transmissive cover includes a flat support unit in contact with the substrate and a plurality of convex portions defined to be separated from each other in the lengthwise direction of the substrate.

5. The light emitting device of claim 1, wherein the light emitting elements include at least one of white, red, blue, and green light emitting diode (LED) chips.

6. The light emitting device of claim 1, wherein the substrate has a plurality of recesses in a lengthwise direction in which the plurality of light emitting elements are disposed.

7. The light emitting device of claim 6, wherein side walls of each of the recesses is formed as a light reflective face.

8. The light emitting device of claim 7, wherein side walls of each of the recesses is formed to be sloped.

9. The light emitting device of claim 6, wherein a resin packaging unit is included to encapsulate the light emitting element within the recess.

10. The light emitting device of claim 9, wherein the resin packaging unit includes a phosphor material for converting the wavelength of light emitted from the light emitting element.

11. The light emitting device of claim 10, wherein the light-transmissive cover is made of a plastic material, and a light refractive index matching unit is formed between the light-transmissive cover and the recess.

12. The light emitting device of claim 11, wherein the light refractive index matching unit is formed of a film made of a silicon or epoxy material.

13. The light emitting device of claim 6, wherein a step portion is formed at an upper edge of the recess.

14. The light emitting device of claim 13, wherein a resin packaging unit encapsulating the light emitting unit is included in the recess, and a light wavelength conversion unit including a phosphor material for converting the wavelength of light emitted from the light emitting element is formed in the step portion to cover an upper surface of the resin packaging unit.

15. The light emitting device of claim 14, wherein the light wavelength conversion unit is formed as a film.

16. The light emitting device of claim 14, wherein the light-transmissive cover is made of a plastic material, and a light refractive index matching unit is formed between the light-transmissive cover and the step portion.

17. The light emitting device of claim 16, wherein the light refractive index matching unit is formed of a film made of a silicon or epoxy material.

18. A method for manufacturing a light emitting device, the method comprising:
   mounting a plurality of light emitting elements in a lengthwise direction on a substrate;
   forming a resin to cover the light emitting elements on the substrate; and
   hardening the resin to have a convex portion and two or more concave portions such that the two or more concave portions are defined at positions corresponding to two or more of the light emitting elements and the convex portion is defined between adjacent ones of the two or more concave portions.

19. The method of claim 18, wherein, in the hardening of the resin, the resin is hardened such that a vertical section of the resin with respect to the lengthwise direction has an indented semi-spherical shape.

20. The method of claim 18, wherein, in the hardening of the resin, the resin is hardened such that the height of the resin is reduced toward edge portions thereof from a central portion thereof.

21. The method of claim 18, wherein the hardening of the resin comprises:
   dispensing a primary resin to cover the entirety of the light emitting elements on the substrate;
   hardening the dispensed primary resin such that the hardened primary resin has a flat face and the two or more concave portions are formed therein;
   dispensing a secondary resin onto the hardened primary resin; and
   hardening the dispensed secondary resin such that the convex portion is defined between the adjacent concave portions.

22. The method of claim 18, wherein, as the resin, one of silicon and epoxy, or a mixture thereof is used.

23. The method of claim 18, further comprising forming a plurality of recesses at regular intervals along the lengthwise direction at an inner side of the substrate, before preparing the substrate.

24. The method of claim 23, further comprising encapsulating a resin packaging unit within each of the recesses, before forming the resin.

25. The method of claim 24, further comprising forming a light refractive index matching unit on an upper surface of the resin packaging unit by using one of silicon and epoxy or a mixture thereof, before forming the resin.

26. The method of claim 18, further comprising forming a plurality of recesses having a step portion at an upper portion thereof at regular intervals in the lengthwise direction at the inner side of the substrate, before preparing the substrate.

27. The method of claim 26, further comprising encapsulating a resin packaging unit within each of the recesses; and forming a light wavelength conversion unit including a phosphor material in each of the step portions to cover an upper surface of the resin packaging unit, before forming the resin.

28. The method of claim 27, further comprising:
   forming a light refractive index matching unit on an upper surface of the substrate by using one of silicon or epoxy or a mixture thereof to cover the light wavelength conversion unit, before forming the resin,
   wherein, in the forming of the resin, the resin is made of a plastic material.

* * * * *